United States Patent [19]

Yabe

[11] Patent Number: 5,732,040

[45] Date of Patent: Mar. 24, 1998

[54] MULTIBIT DRAM

[75] Inventor: Tomoaki Yabe, Kawasaki, Japan

[73] Assignee: Kabushiki Kaisha Toshiba, Kawasaki, Japan

[21] Appl. No.: 800,509

[22] Filed: Feb. 14, 1997

[30] Foreign Application Priority Data

Mar. 1, 1996 [JP] Japan .................. 8-044804

[51] Int. Cl.$^6$ .................. G11C 8/00
[52] U.S. Cl. .................. 365/230.03; 365/230.08; 365/189.01
[58] Field of Search .................. 365/230.03, 230.08, 365/63, 230.02, 189.01, 189.02

[56] References Cited

U.S. PATENT DOCUMENTS 5,274,596  12/1993  Watanabe .................. 365/203
5,274,597  12/1993  Ohbayashi et al. .................. 365/204
5,528,552  6/1996  Kamisaki .................. 365/230.03

OTHER PUBLICATIONS

IEEE Journal of Solid-State Circuits, vol. 30, No. 11, Nov. 1995; "A. 1.6 Gbyte/s Data Transfer Rate * Mb Embedded DRAM", Shinji Miyano, et al.

1993 IEEE International Solid-State Circuits Conference, Session 3, *Non-Volatile, Dynamic, and Experimental Memories*, Paper WP 3.5: "A 30ns 256Mb DRAM with Multi-Divided Array Structure", Tadahiko Sugibayashi, et al.

*Primary Examiner*—Vu A. Le
*Attorney, Agent, or Firm*—Banner & Witcoff, Ltd.

[57] ABSTRACT

A memory cell array is divided into m×n blocks, m columns of blocks in the direction of row and n rows of blocks in the direction of column, each block having dynamic memory cells arranged in a matrix. Sense amplifier circuits are provided so as to correspond to the blocks and amplify the data read from the selected memory cell or the data to be written into the selected memory cell. Data buses are provided so as to correspond to the blocks and are connected to the sense amplifier circuits via column select gates. A row decode circuit decodes a row address signal and selects a row of memory cells in the memory cell array. A column decode circuit decodes a column address signal and specifies a column of memory cells in the memory cell array. Those of the blocks arranged in the same row in the memory cell array share the row decode circuit and said data buses. Those of the blocks arranged in the same column in the memory cell array share the column decode circuit. An n number of blocks arranged in a column of the blocks are selectively activated simultaneously, and the data in the memory cells in the column selected by the column decode circuit is read and written in parallel via the individual data buses for the activated blocks.

20 Claims, 8 Drawing Sheets

MULTIBIT DRAM

BACKGROUND OF THE INVENTION

This invention relates to a semiconductor memory device, and more particularly to a multibit DRAM.

Figure 1:
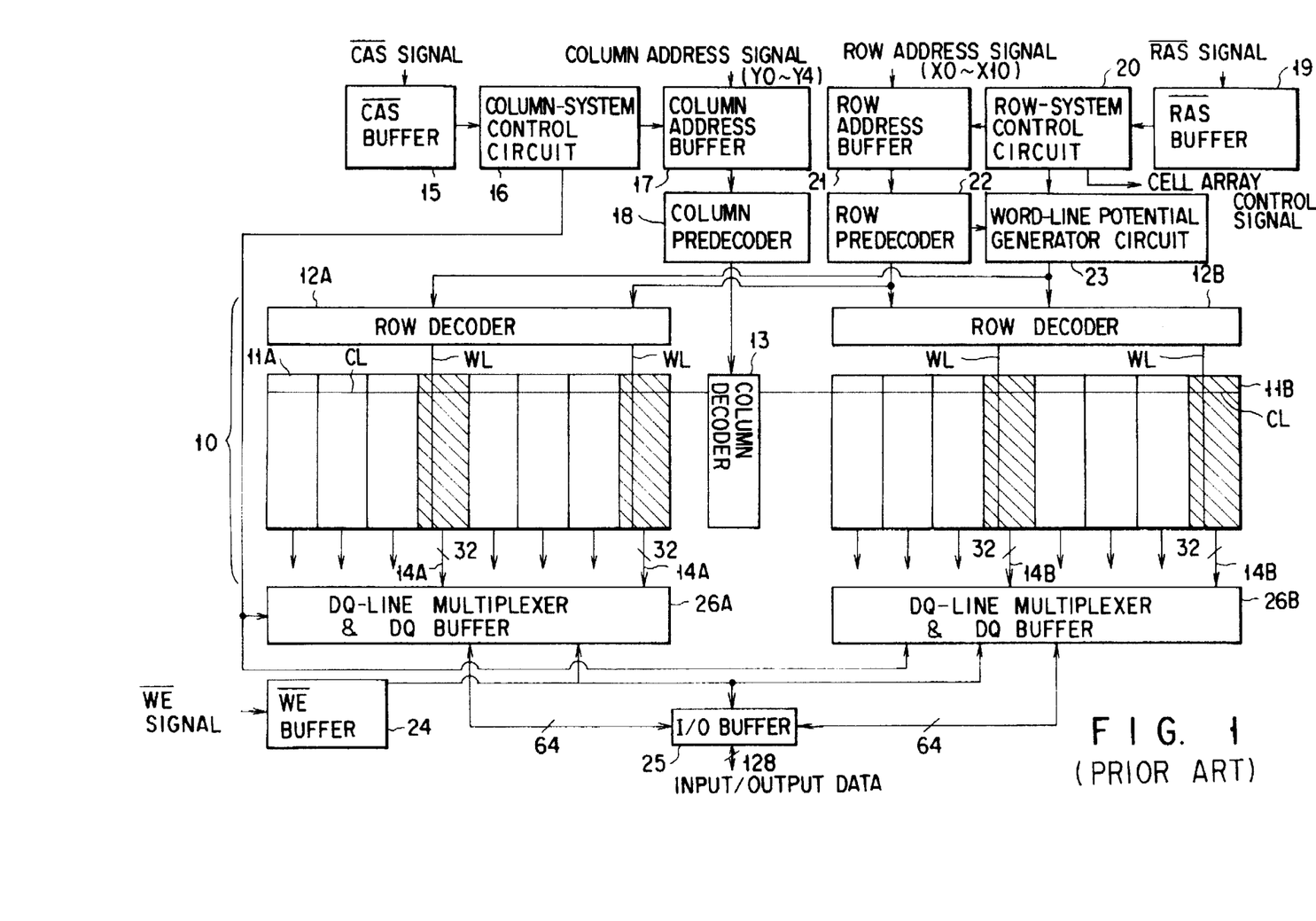
FIG. 1 is a block diagram of a DRAM with 8M bits×128 inputs and outputs, schematically the configuration of a conventional semiconductor memory device.

FIG. 1 schematically shows the configuration of a conventional semiconductor memory device and is a block diagram of a DRAM with 8M bits×128 inputs and outputs. This type of multibit DRAM has been described in, for example, Miyano et. al., "A 1.6 Gbyte/s Data Transfer Rate 8 Mb Embedded DRAM," IEEE JOURNAL OF SOLID-STATE CIRCUITS, Vol. 30, No. 11, November, 1995, pp. 1–5.

Such an ultra-multibit input/output DRAM has recently been used for an LSI provided with a graphics controller and memory to perform the image processing for a workstation or a personal computer. Since there has been a strong demand for this type of DRAM to consume less electrical power, a DRAM with a larger number of refresh cycles (e.g., 2K refresh cycles or 4K refresh cycles) to decrease the power consumption of the RAS cycle. FIG. 1 shows the configuration of a 2K-refresh-cycle DRAM.

As shown in FIG. 1, a memory core section 10 includes memory cell arrays 11A, 11B, row decoders 12A, 12B, and a column decoder 13. Each of the memory cell arrays 11A, 11B consists of 2048 rows×32 columns×128 bits (=8M bits). In the embodiment, each of the memory cell arrays 11A, 11B consists of 8 blocks. Namely, the memory cell arrays 11A, 11B are composed of 16 blocks in total, each block consisting of 512 rows×1024 columns (=0.5M bits). The data input/output is carried out via DQ buses 14A, 14B from each of the blocks. The row decode signal outputted from the row decoder 12A is supplied to each word line WL in the memory cell array 11A. The row decode signal outputted from the row decoder 12B is supplied to each word line WL in the memory cell array 11B. The column decode signal outputted from the column decoder 13 is supplied to the common column select lines CL in the memory cell arrays 11A, 11B.

A /CAS ("/" before the reference symbol means an inverted signal or a bar) buffer 15 receives a /CAS (column address strobe) signal. A column-system control circuit 16 controls the circuits of the column system in response to the output of the /CAS buffer 15. Column address signals Y0 to Y4 are inputted to a column address buffer 17, which is controlled by the output of the column-system control circuit 16. A column predecoder 18 predecodes the column address signal outputted from the column address buffer 17. The predecode signal outputted from the column predecoder 18 is supplied to the column decoder 13.

A /RAS buffer 19 receives a /RAS (row address strobe) signal. A row-system control circuit 20 controls the circuits of the row system in response to the output of the /RAS buffer 19. The row-system control circuit 20 outputs cell array control signals, including a sense amplifier activating signal, an equalize signal, and an FIT signal. A row address buffer 21 receives row address signals X0 to X10 and is controlled by the output of the row-system control circuit 20. A row predecoder 22 predecodes the row address signal outputted from the row address buffer 21. A word-line potential generator circuit 23 is controlled by the output of the row-system control circuit 20 and receives the predecode signal outputted from the row predecoder 22 and then generates a word-line potential. The predecode signal from the row predecoder 22 and the word-line potential from the word-line potential generator circuit 23 are supplied to the row decoders 12A and 12B, respectively.

A /WE buffer 24 receives a /WE (write enable) signal. An I/O buffer 25 is controlled by the /WE buffer 24 and receives and supplies the data. The data inputted to the I/O buffer 25 is supplied to circuit blocks 26A, 26B. Each of the circuit blocks 26A, 26B includes a DQ-line multiplexer and a DQ buffer and is controlled by the column-system control circuit 16. The data inputted to the I/O buffer 25 is supplied to each memory cell via the circuit blocks 26A, 26B and DQ buses 14A, 14B. The data read from the memory cells are outputted from the I/O buffer 25 via the DQ buses 14A, 14B and circuit blocks 26A, 26B.

Figure 2:
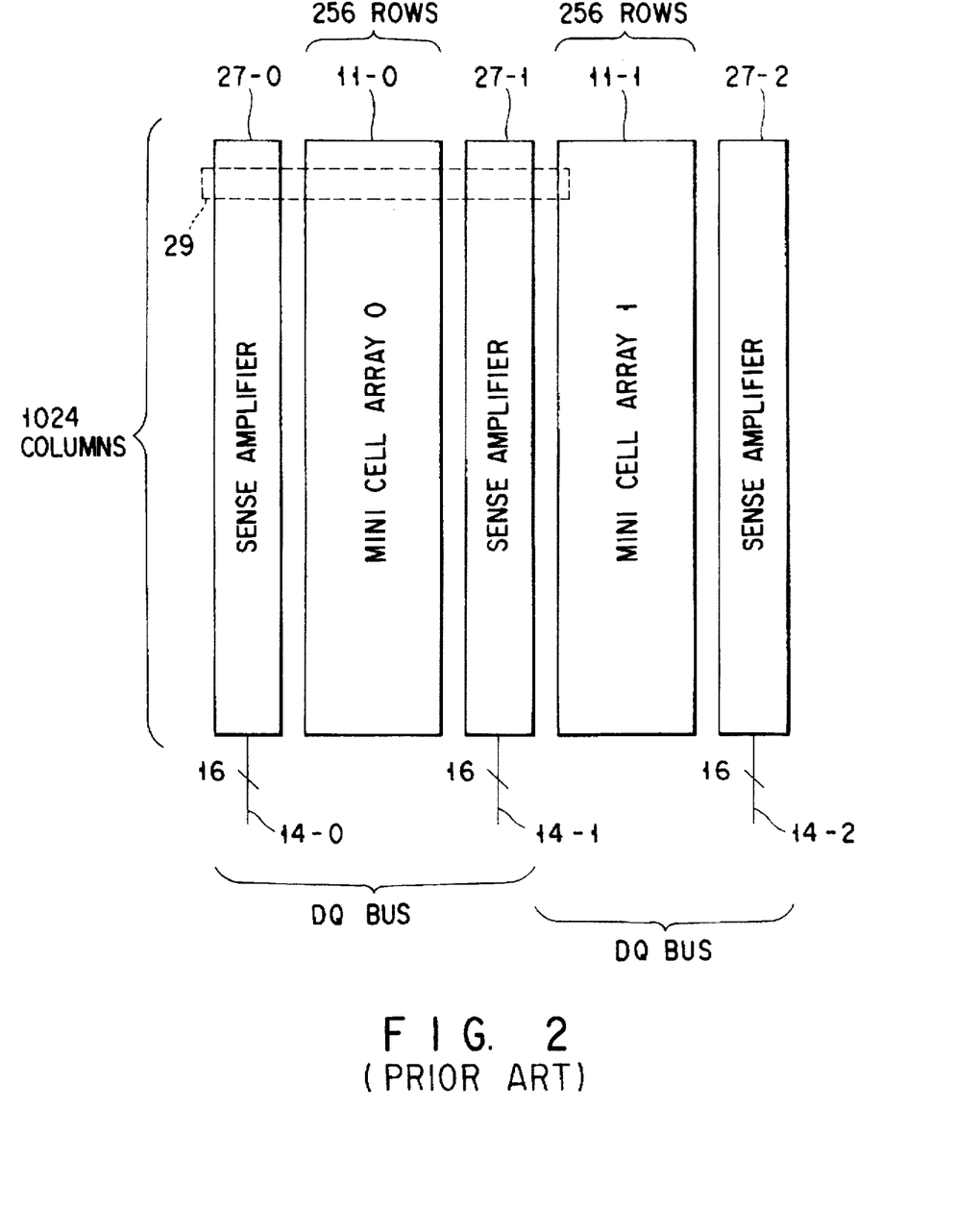
FIG. 2 is a block diagram of one block extracted from the memory cell array in the circuit of FIG. 1.

FIG. 2 shows one block extracted from the memory cell arrays 11A, 11B in the circuit shown in FIG. 1. Each block is composed of two mini cellarrays (subblocks) 11-0, 11-1 each having a capacity of 256 rows×1024 columns=256K bits. On both side of each of the mini cell arrays 11-0, 11-1, the sense amplifiers 27-0, 27-1, and 27-2 are provided. These sense amplifiers 27-0, 27-1, and 27-2 have a shared-sense amplifier structure to prevent an increase in the chip area. Specifically, the sense amplifier 27-1 sandwiched between the mini cell arrays 11-0, 11-1 is shared by these mini cell arrays 11-0, 11-1. On both sides of each of the mini cell arrays 11-0, 11-1, 16-pair DQ buses 14-0, 14-1, and 14-2 are provided. Because the mini cell arrays 11-0, 11-1 are controlled so that only one of them may be activated at a time, the shared-sense amplifiers amplify and hold the cell data in the mini cell array that has been activated. The data buses (32 pairs in total) on both sides of the activated mini cell array output the data held in the sense amplifier.

Figure 3:
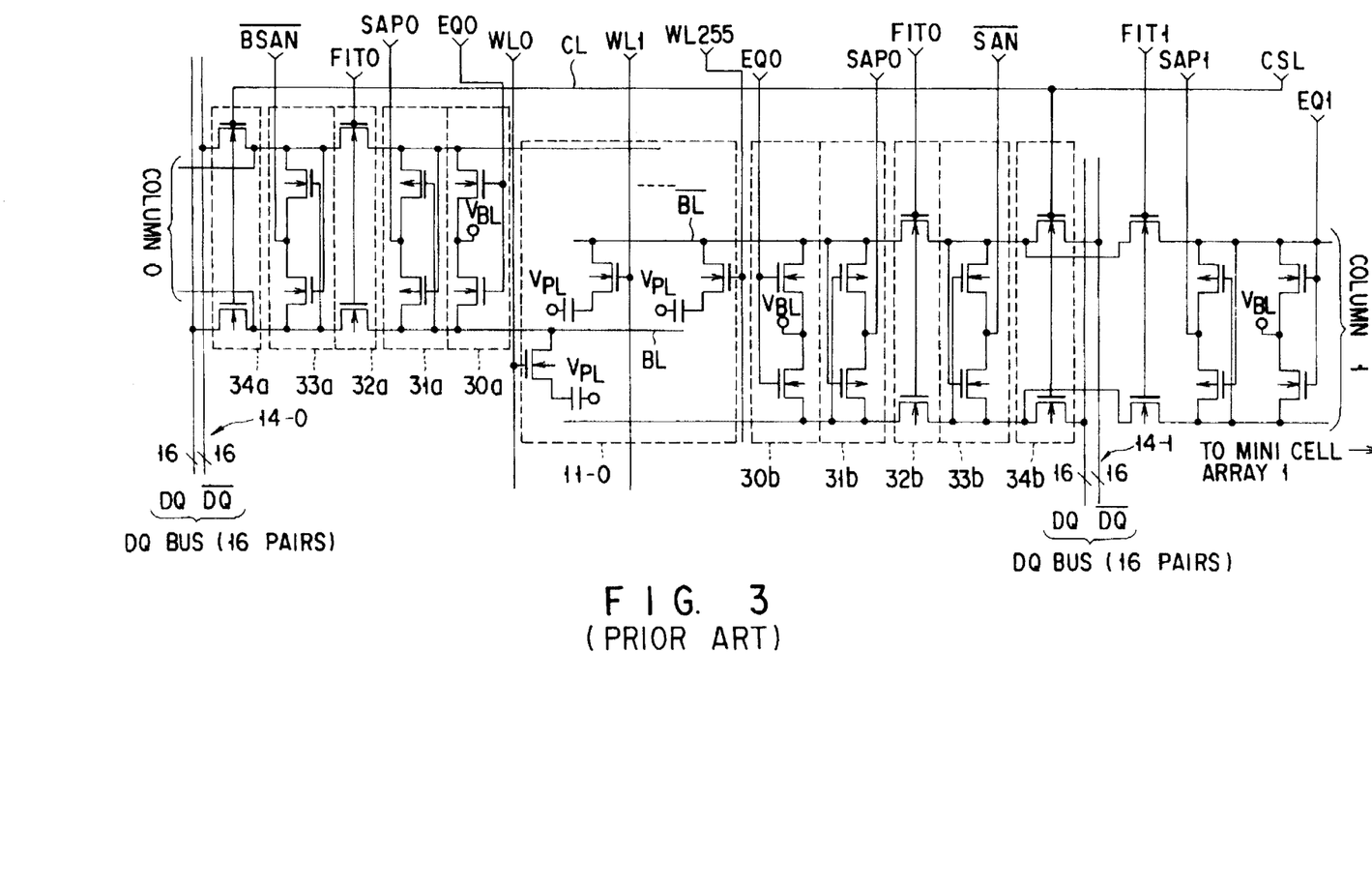
FIG. 3 is a circuit diagram of column 0 and column 1 of the 1024 columns in the mini cell array, giving a more detailed explanation of the configuration of the mini cell array of FIG. 2.

FIG. 3 is a circuit diagram of the area enclosed by a broken line 29 in FIG. 2, giving a more detailed description of the configuration of mini cell array 11-0. FIG. 3 shows the circuits of column 0 and column 1 extracted from the 1024 columns in mini cell array 11-0. Each of column 2 and later has the same configuration. The data at an even address (here, column 0) is outputted from DQ bus 14-0 on the left side of mini cell array 11-0. The data at an odd address (here, column 1) is outputted from DQ bus 14-1 on the right side of mini cell array 11-0. Although not shown, 32 columns are connected to a single common column select line CL. A column select signal CSL is supplied to each of these columns. Of the 32 columns, 16 columns are connected to the 16-pair DQ bus 14-0 on the left side of mini cell array 11-0 and the remaining 16 columns are connected to the 16-pair DQ bus 14-1 on the right side of the mini cell array 11-0.

On both sides of the mini cell array 11-0, there are provided bit-line equalizers 30a, 30b, p-channel sense amplifiers 31a, 31b, FIT gates 32a, 32b, n-channel sense amplifiers 33a, 33b, column select gates 34a, 34b, and DQ buses 28-0, 28-1. The bit-line equalizers 30a, 30b are supplied with an equalize signal EQ0, which controls these equalizers. Then, the equalizers equalize the bit-line pair BL, /BL to a potential $V_{BL}$. The p-channel sense amplifiers 31a, 31b are supplied with a sense amplifier activating signal SAP0, which controls these amplifiers. The FIT gates 32a, 32b are supplied with an FIT signal FIT0, which controls these gates. The n-channel sense amplifiers 33a is supplied with a sense amplifier activating signal /BSAN, which controls this amplifier. The n-channel sense amplifier 33b is supplied with a sense amplifier activating signal /SAN, which controls this amplifier. The column select gates 34a, 34b are supplied with a column select signal CSL, which controls these gates.

Here, the FIT gate 32b, n-channel sense amplifier 33b, column select gate 34b, and DQ bus 28-1 in the area sandwiched by the mini cell arrays 11-0, 11-1 are shared by the two mini cell arrays 11-0 and 11-1. Although not shown in FIGS. 2 and 3, when a mini cell array is present on the left side of mini cell array 11-0, the FIT gate 32a, n-channel sense amplifier 33a, column select gate 34a, and DQ bus 14-0 are shared by mini cell array 11-0 and the mini cell array provided on the left side of mini cell array 11-0. Similarly, the circuit component parts provided on the right side of mini cell array 11-1, that is, the FIT gate 32b, n-channel sense amplifier 33b, column select gate 34b, and DQ bus 14-1 are shared by mini cell array 11-1 and the mini cell array provided on the right side of mini cell array 11-1.

The circuit component parts shared by the mini cell arrays 11-0 and 11-1 are selectively used, being controlled as follows. When word line WL0 is selected and mini cell array 11-0 is activated, the signal FIT0 simultaneously goes high and is selected (at this time, the signal FIT1 is at the low level), which turns on the FIT gate 32a, causing the n-channel sense amplifier 33a and column select gate 34a to be connected to mini cell array 11-0. In this state, when the data in the memory cell selected by word line WL0 appears on bit line BL, signal SAP0 and signal /SAN are activated from the Vcc/2 precharged state to the high level and low level, respectively, (signal SAP1 remains in the Vcc/2 precharged state), which latches the cell data in the p-channel sense amplifier 31a and n-channel sense amplifier 33a.

In contrast, when the mini cell array 11-1 is activated, signal FIT1, signal /SAN, and signal SAP1 are activated, whereas signal FIT0 remains at the low level and signal SAP0 remains in the Vcc/2 precharged state.

In this way, only one word line for a total of 512 rows in the mini cell arrays 11-0, 11-1 is activated at a time. The data in the column selected by the common column select signal CSL is read from the 32-pair DQ buses on both sides of the activated mini cell array.

As shown in FIG. 1, the DQ buses 14A, 14B are connected to the DQ buffers via the DQ multiplexers. Here, the DQ-line multiplexer selects the DQ-line pair from which the data has been read and connects it to the DQ buffer. The data further amplified by the DQ buffer is outputted to the input/output data bus via the I/O buffer 25. The common column select signal line CSL is shared by 16 blocks (i.e., 32 mini cell arrays). With specific row address signals (11 bits of X0 to S10), the row decoders 12A, 12B activate the word lines in four blocks simultaneously (which causes a total of 32×4=128 DQ-line pairs to output the data). As seen from this, to refresh all of the rows, 512 rows/block×4 blocks=2K cycles is required. A word line activated at 2K cycles is selected by a row address signal consisting of 11 bits ($2^{11}$=2K) in X0 to X10.

A conventional DRAM with 8M bits×128 inputs and outputs at 2K refresh cycles was constructed as described above. The above-described configuration, however, had to draw 32 DQ-line pairs from each block, resulting in the large area occupied by the DQ-line pairs in the whole of the memory core section.

It should be noted that the number of DQ-line pairs to be drawn increases, as the number of refresh cycles is increased to make less the drawn current in the RAS cycle (e.g., set the number of refresh cycles at 4K refresh cycles). Specifically, with a 4K-refresh-cycle configuration, the number of word lines WL activated simultaneously in the circuit of FIG. 1 is two, so that 64 DQ-line pairs must be drawn from a single block to obtain 128 inputs and outputs, making the area occupied by the DQ-line pairs twice that in the case of 2K refresh cycles.

As described above, a conventional DRAM has the problem of increasing the chip size seriously in an attempt to make multibit input/output compatible with a large number of refresh cycles.

BRIEF SUMMARY OF THE INVENTION

The object of the present invention is to provide a semiconductor memory device capable of making multibit input/output compatible with a large number of refresh cycles without increasing the chip size seriously.

The foregoing object is accomplished by providing a semiconductor memory device comprising: a memory cell array divided into m×n blocks, m columns of blocks in the direction of row and n rows of blocks in the direction of column, each block having dynamic memory cells arranged in a matrix; sense amplifier circuits which are provided so as to correspond to the blocks and amplify the data read from the selected memory cell or the data to be written into the selected memory cell; data buses provided so as to correspond to the blocks and connected to the sense amplifier means via column select gates; a row decode circuit for decoding a row address signal and selecting a row of memory cells in the memory cell array; and a column decode circuit for decoding a column address signal and specifying a column of memory cells in the memory cell array, wherein those of the blocks arranged in the same row in the memory cell array share the row decode circuit and the data buses, those of the blocks arranged in the same column in the memory cell array share the column decode circuit, n blocks arranged in a column of the blocks are selectively activated simultaneously, and the data in the memory cells in the column selected by the column decode means is read and written in parallel via the individual data buses for the activated blocks.

With the above configuration, because a memory cell array is divided into m×n blocks, m columns of blocks in the direction of row and n rows of blocks in the direction of column, and n blocks arranged in a column of the blocks are selectively activated simultaneously, thereby reading and writing the data, this reduces the number of data buses drawn from the individual blocks and helps decrease the area occupied by the data buses remarkably. As a result, it is possible to make the multibit input and output compatible with a large number of refresh cycles without increasing the chip size seriously.

By constructing the row decode circuit out of a main row decode circuit and a subordinate decode circuit so as to form a hierarchical word-line structure, it is possible to suppress an increase in the chip size due to an increase in the number of row decode circuits.

Furthermore, an increase in the chip size is further suppressed by dividing each of the blocks into subblocks, causing those subblocks to share the data buses, and enabling data exchange between the main data bus and the above data buses.

The foregoing object is also accomplished by providing a semiconductor memory device comprising: a first dynamic memory cell array having a plurality of memory cell array groups divided in the direction of row; a second memory cell array that is arranged adjacently in the direction of row of the first memory cell array and has a plurality of memory cell array groups divided in the direction of row; column decoder groups arranged between the memory cell array groups in the first and second memory cell arrays; common column select lines to which the decode output is supplied from the column decoder groups and which select a column of memory cells in each memory cell array group; a first global row decoder for selecting a memory cell array group from the first memory cell array; first local row decoder groups that are provided between the memory cell array groups in the first memory cell array and decodes the output of the first global row decoder and select a row of memory cells from the memory cell array groups; a second global row decoder for selecting a memory cell array group from the second memory cell array; second local row decoder groups that are provided between the memory cell array groups in the second memory cell array and that decode the output of the second global row decoder and select a row of memory cells from the memory cell array group; first sense amplifier groups that are provided between the memory cell array groups in the first memory cell array and amplify the data read from the selected memory cell or the data to be written into the selected memory cell; second sense amplifier groups that are provided between the memory cell array groups in the second memory cell array and amplify the data read from the selected memory cell or the data to be written into the selected memory cell; first DQ bus groups connected to the first sense amplifier groups via first column select gate groups; and second DQ bus groups connected to the second sense amplifier groups via second column select gate groups, wherein the memory cell array groups in the first memory cell array share the first DQ bus groups, the memory cell array groups in the second memory cell array share the second DQ bus groups, the same columns in the first and second memory cell groups are selectively activated simultaneously, and the data in the memory cells in the column selected by the column decoder group is read and written in parallel via the first and second data DQ bus groups in the activated first and second memory cell array groups.

With the configuration described above, because the first and second memory cell arrays are each divided in the direction of column, and the block groups arranged in the same column in each of the memory cell arrays are selectively activated simultaneously, thereby reading and writing the data in parallel from and into the memory cells, the number of DQ buses drawn from each block is reduced, leading to a remarkable decrease in the chip area occupied by the DQ buses. As a result, it is possible to make the multibit input and output compatible with a large number of refresh cycles without increasing the chip size seriously.

Furthermore, because the parasitic capacitance on the DQ buses is decreased by dividing the first DQ bus groups and second DQ bus groups and providing the first and second DQ-line multiplexers and the first and second DQ buffers between the memory cell array groups, a high-speed operation is possible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 4A:
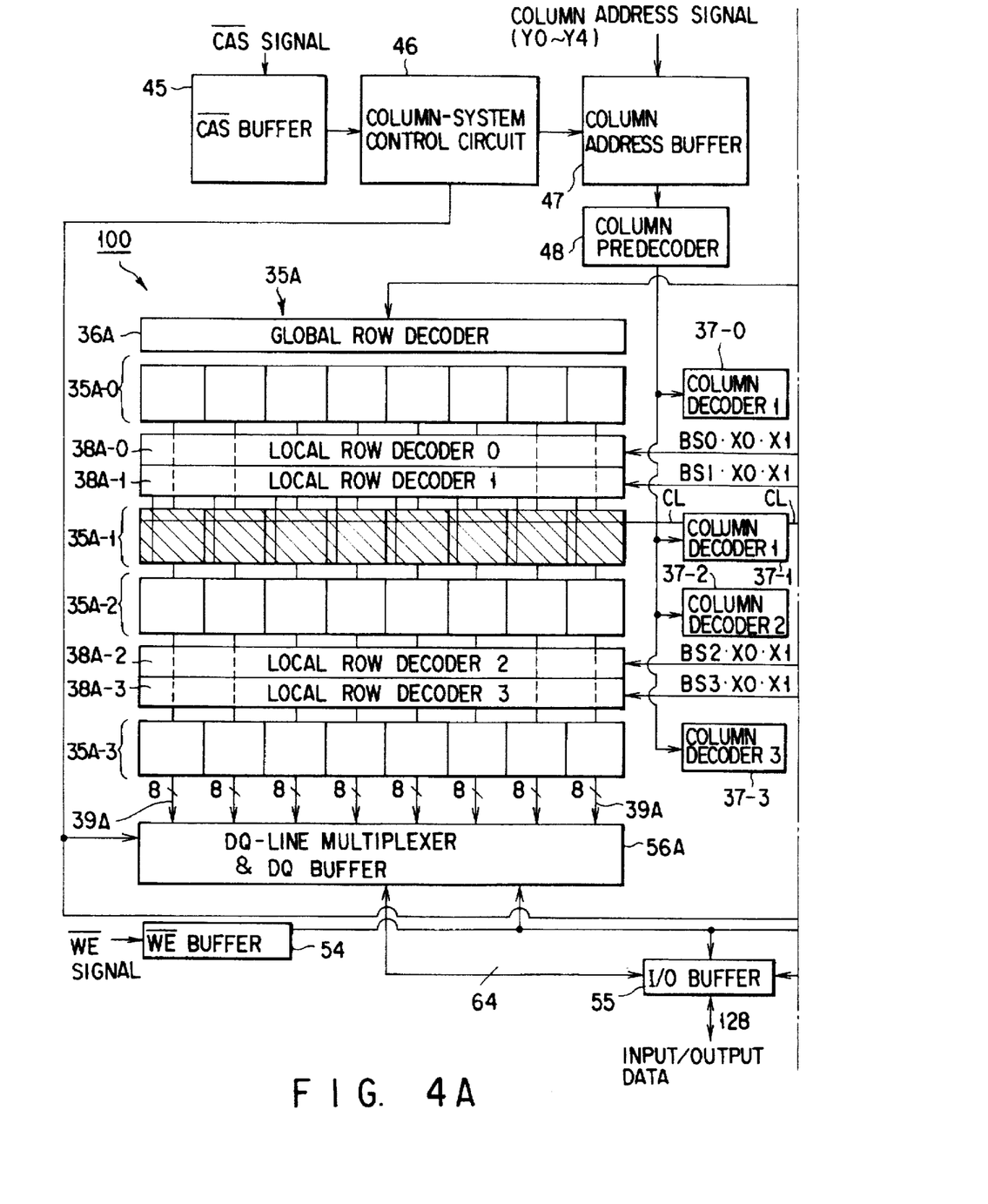
FIGS. 4A and 4B are block diagrams of a DRAM to help explain a semiconductor memory device according to a first embodiment of the present invention.
Figure 4B:
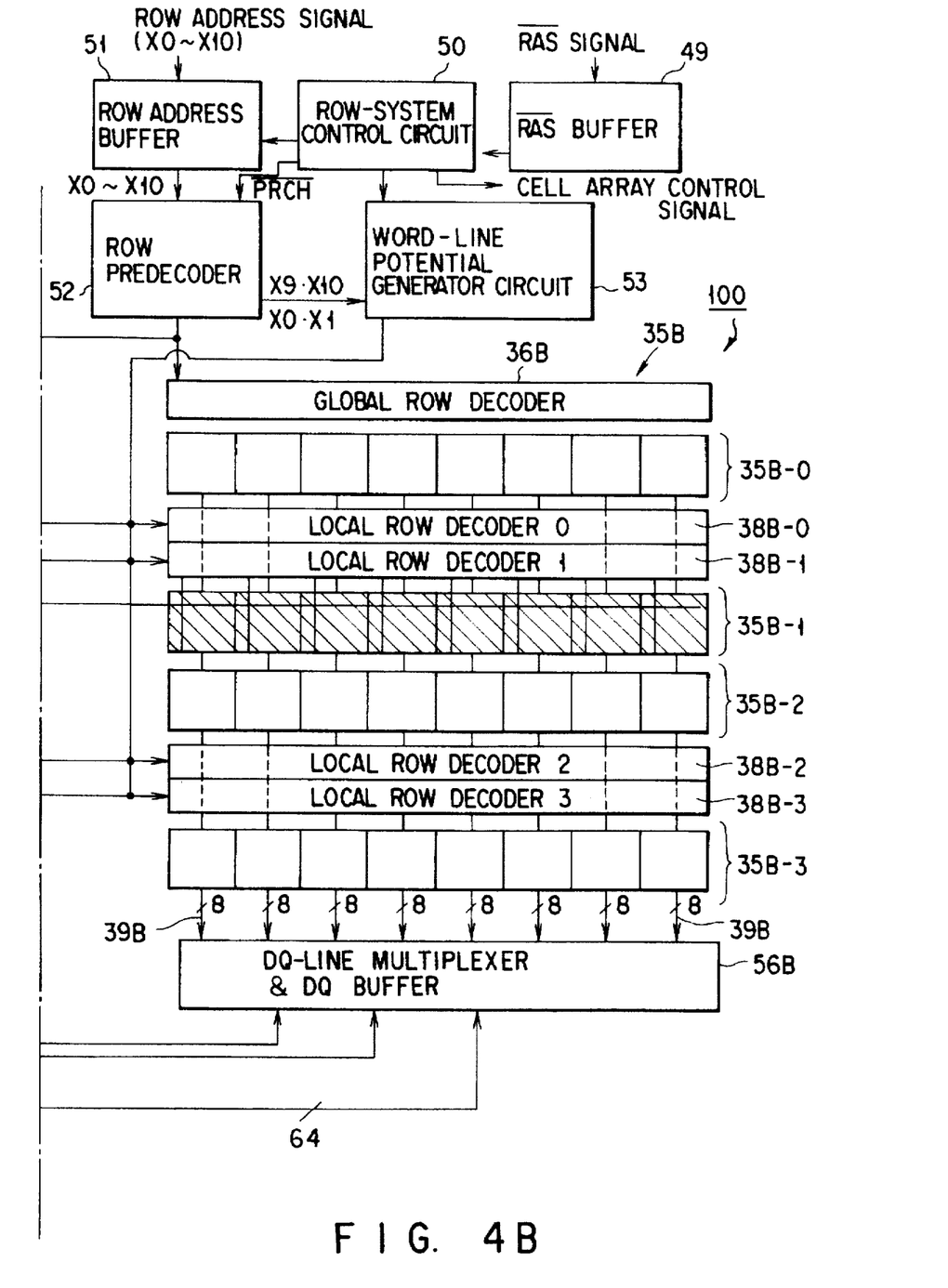

FIGS. 4A and 4B are schematic block diagrams of a semiconductor memory device according to a first embodiment of the present invention. The semiconductor memory device is a DRAM with 8M bits×128 inputs and outputs as in FIG. 1. In this embodiment, a hierarchical word-line method (refer to, for example, T. Sugibayashi et. al., "A 30-ns 256-Mb DRAM with Multi-divided Array Structure," the 1993 IEEE International Solid-State Circuits Conference DIGEST OF TECHNICAL PAPERS, Feb. 24, 1993, pp. 50–51) is used.

The semiconductor memory device comprises a memory core section 100, a /CAS buffer 45, a column-system control circuit 46, a column address buffer 47, a column predecoder 48, a /RAS buffer 49, a row-system control circuit 50, a row address buffer 51, a row predecoder 52, a word-line potential generator circuit 53, a /WE buffer 54, and an I/O buffer 55.

The memory core section 100 comprises memory cell arrays 35A, 35B, global decoders 36A, 36B, column decoders 37-0 to 37-3, local decoders 38A-0 to 38A-3, 38B-0 to 38B-3, and circuit blocks 56A, 56B. Each of the memory cell arrays 35A, 35B is quadrisected in the direction of row and octosected in the direction of column. In other words, in the memory core section, a memory cell array is provided which consists of 64 blocks, four columns of blocks being arranged in the row direction and 16 rows of blocks being arranged in the direction of column. The local row decoders 38-A to 38A-3 are provided so as to correspond to the memory cell arrays 35A-0 to 35A-3. Similarly, the local row decoders 38B-0 to 38B-3 are provided so as to correspond to the memory cell arrays 35B-0 to 35B-3. The word-line potential generator circuit 53 supplies a BS0·X0·X1 signal as a word-line boosted potential to the local row decoders 38A-0, 38B-0. The word-line potential generator circuit 53 supplies a BS1·X0·X1 signal as a word-line boosted potential to the local row decoders 38A-1, 38B-1. The word-line potential generator circuit 53 supplies a BS2·X0·X1 signal as a word-line boosted potential to the local row decoders 38A-2, 38B-2. The word-line potential generator circuit 53 supplies a BS3·X0·X1 signal as a word-line boosted potential to the local row decoders 38A-3, 38B-3. Between the memory cell arrays 35A, 35B, the column decoders 37-0 to 37-3 are provided. The blocks belonging to the memory cell array group in the same column share the common column select signal line CL with those column decoders 37-0 to 37-3. The column predecoder 48 supplies a predecode signal to the column decoders 37-0 to 37-3 to control these decoders. Each of the 64 blocks is connected to eight pairs of DQ buses 39A, . . . , 39A and 39B, . . . , 39B. These DQ buses 39A or 39B are shared by the blocks in the same row. Therefore, a total of 8×16=128 pairs of DQ buses are drawn from the 16 rows of blocks and are supplied to the circuit blocks 56A, 56B. Each of the circuit blocks 56A, 56B includes a DQ-line multiplexer and a DQ buffer and is controlled by the column-system control circuit 46 and /WE buffer 54. The data inputted to the I/O buffer 55 is supplied to each memory cell via the circuit blocks 56A, 56B and DQ buses 39A, 39B. The data read from the memory cell is outputted from the I/O buffer 55 via the DQ buses 39A, 39B and circuit blocks 56A, 56B. The switching between the input operation and output operation of the I/O buffer 55 is effected by the output of the /WE buffer 54.

The basic configuration and operation of the peripheral circuitry of the memory core section 100 are the same as those of the circuit of FIG. 1 except that the row-system control circuit 50, row predecoder 52, and word-line potential generator circuit 53 differ from those of FIG. 1 because the hierarchical word-line method has been used.

The /CAS buffer 45 receives the /CAS (column address strobe) signal. In response to the output of the /CAS buffer 45, the column-system control circuit 46 controls the circuits of the column system. The column address buffer 47 receives the column address signals Y0 to Y4 and is controlled by the output of the column-system control circuit 46. The column predecoder 48 predecodes the column address signal outputted from the column address buffer 47 and outputs the predecoded signal to the column decoders 37-0 to 37-3.

The /RAS buffer 49 receives the /RAS (row address strobe) signal. In response to the output of the /RAS buffer 49, the row-system control circuit 50 controls the circuits of the row system. The row-system control circuit 50 outputs the cell array control signals, including a sense amplifier activating signal, an equalize signal, and an FIT signal. The row address buffer 51 receives the row address signals X0 to X10 and is controlled by the output of the row-system control circuit 50. The row address signals X0 to X10 outputted from the row address buffer 51 and the precharge signal /PRCH outputted from the row-system control circuit 50 are supplied to the row predecoder 52. The word-line potential generator circuit 53 is controlled by the output of the row-system control circuit 50. Receiving the predecoded signals X9·X10 and X0·X1 outputted from the row predecoder 52, the word-line potential generator circuit 53 generates a word-line boosted potential and supplies it to the local row decoders 38A-0 to 38A-3 and 38-B-0 to 38B-3.

The /WE buffer 54 receives the /WE (write enable) signal. The I/O buffer 55 is controlled by the /WE buffer 54 and receives and outputs the data. The data inputted to the I/O buffer 55 is supplied to the circuit blocks 56A, 56B. Each of the circuit blocks 56A, 56B includes a DQ-line multiplexer and a DQ buffer and is controlled by the column-system control circuit 46. The data inputted to the I/O buffer 55 is supplied to each memory cell via the circuit blocks 56A, 56B and DQ buses 39A, 39B. The data read from the memory cells is outputted from the I/O buffer via the DQ buses 39A, 39B and circuit blocks 56A, 56B.

Figure 5:
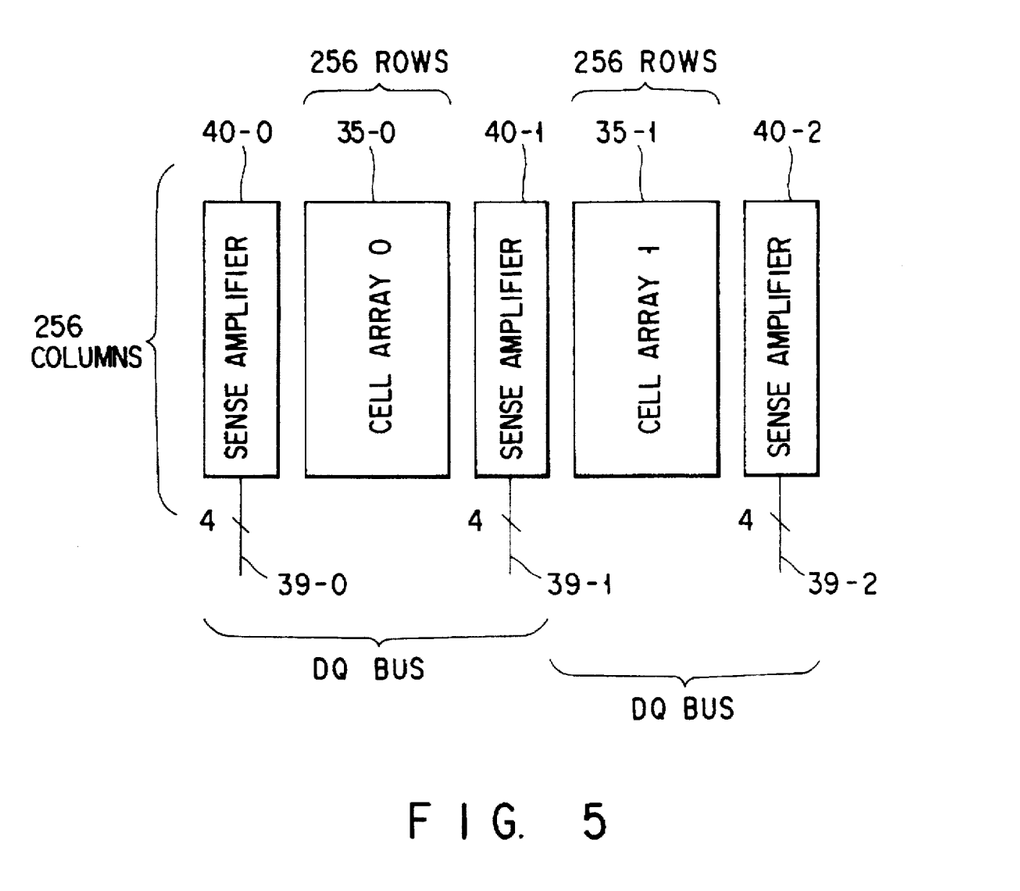
FIG. 5 is a block diagram of one block extracted from the memory cell array in the circuit of FIGS. 4A and 4B.

FIG. 5 is an enlarged view of one block in the block diagrams of FIGS. 4A and 4B. Each block consists of two mini cell arrays (subblocks) 35-0, 35-1, each block having a capacity of 256 rows×256 columns=64K bits. On both sides of these mini cell arrays 35-0, 35-1, sense amplifiers 40-0, 40-1, 40-2 are provided. The sense amplifiers 40-0, 40-1, 40-2 are shared-sense amplifiers to prevent an increase in the chip area. Namely, the sense amplifier 40-1 in the area sandwiched by the mini cell arrays 35-0, 35-1 is shared by the mini cell arrays 35-0, 35-1. On both sides of the mini cell arrays 35-0, 35-1, 4-pair DQ buses 39-0, 39-1, 39-2 are provided. Since the mini cell arrays 35-0, 35-1 are controlled so that only one of them may be activated at a time, the shared-sense amplifier amplifies and holds the cell data in the activated mini cell array and outputs the held data via a total of eight pairs of DQ buses (data buses) on both side of the activated mini cell array.

The block of FIG. 5 differs from the conventional block of FIG. 2 in that the number of columns is 256, one-fourth of 1024, the number of columns in the conventional block, and in that the number of DQ buses drawn from each shared-sense amplifier is four pairs of DQ buses, one-fourth of 16 pairs of DQ buses in the conventional block. A detailed circuit configuration of the sense amplifier and related circuitry are the same as those of FIG. 3. The operation of the shared-sense amplifier is basically the same as in the prior art.

Figure 6:
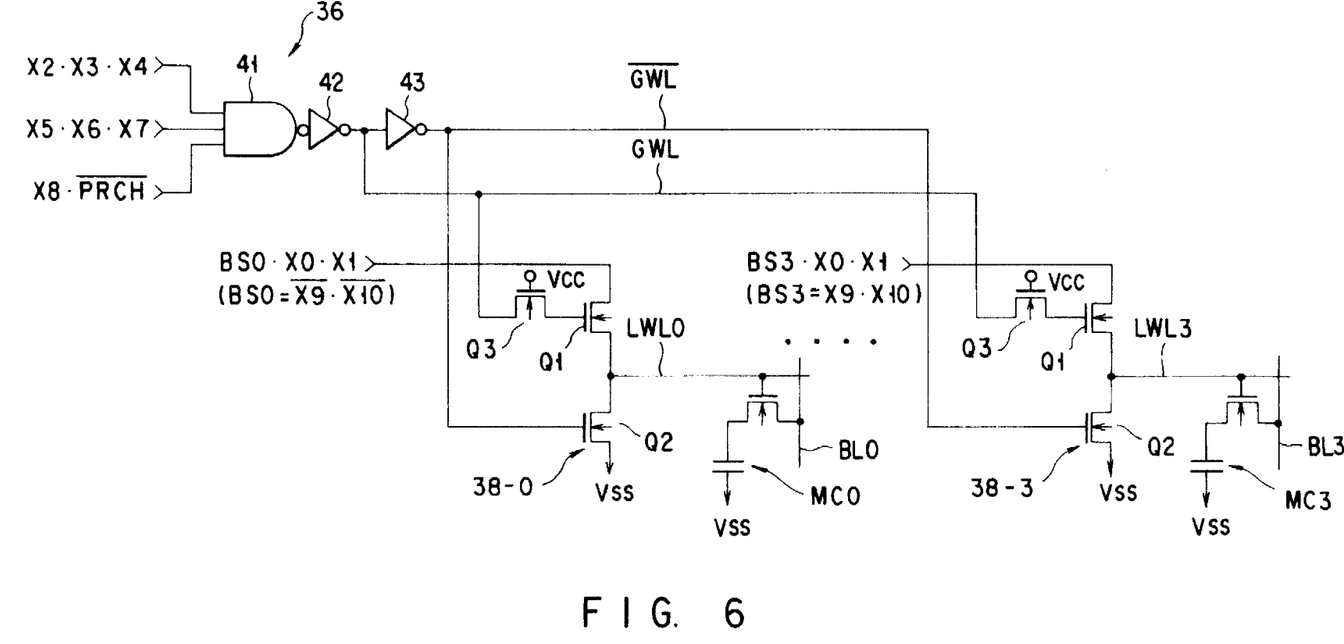
FIG. 6 is a circuit diagram of the global row decoder and local row decoder in the circuit of FIGS. 4A and 4B.

FIG. 6 shows an example of the configuration of the circuit section related to the hierarchical word-line method used in the circuit shown in FIGS. 4A and 4B. The circuit section includes a global row decoder 36 and four local decoders 38-0, . . . , 38-3 connected to each of the global word lines GWL and /GWL to which the output of the global decoder 36 is supplied. The global row decoder 36 is composed of a NAND gate 41 and inverters 42, 43. The predecode signal X2·X3·X4 outputted from the row predecoder 52 is supplied to a first input terminal of the NAND gate 41. The predecode signal X5·X6·X7 outputted from the row predecoder 52 is supplied to a second input terminal of the NAND gate 41. The signal X8·/PRCH of the logical product of the predecoded signal X8 outputted from the predecoder 52 and the word-line precharge signal /PRCH is supplied to a third input terminal of the NAND gate 41. Each of the local decoders 38-0, . . . , 38-3 is composed of a bootstrap-type booster circuit and includes a pull-up n-channel MOS transistor Q1 for local word lines LWL0, . . . , LWL3, a pull-down n-channel MOS transistor Q2 for local word lines LWL0, . . . , LWL3, and an n-channel MOS transistor Q3 set to conduct at a power supply potential Vcc. The signals BS0·X0·X1 (BS0=/X9·/X10) to BS3·X0·X1 (BS3=X9·X10) supplied from the word-line potential generator circuit 53 are supplied to the drains of the individual pull-up MOS transistors Q1. The local word lines LWL0, . . . , LWL3 are connected to the output terminals of the local row decoders 38-0, . . . , 38-3, respectively. The memory cells MC0, . . . , MC3 are placed at the intersections of the local word lines LWL0, . . . , LWL3 and the bit lines BL0, . . . , BL3, respectively.

Next, the operation of the circuit of FIG. 6 will be explained. The global row decoder 36 decodes the 7-bit row address signals (X2 to X8) and the word-line precharge signal /PRCH and drives the global word lines GWL, /GWL. Specifically, when the word-line precharge signal /PRCH is at the high level, the global row decoder 36 selected by the row address signal X2 to X8 is activated, bringing the global word line /GWL into the low level and GWL into the high level. On the other hand, the local row decoders 38-0, . . . , 38-3 connected to the global word lines /GWL, GWL are selected by the 2-bit row address signal X0, X1 and local row decoder select signals BS0 to BS3 (BSi is decoded by the 2-bit row address input X9, X10). The word-line boosted potential is supplied as the BSi·X0·X1 inputted to the drains of the pull-up MOS transistors in the local decoders 38-0, . . ., 38-3, when these transistors are activated. This raises the selected local word line to the word-line boosted potential. As shown in FIG. 4, the blocks belonging to the same memory cell array group share the local row decoder. As seen from FIG. 6, they also share the local row decoder select signal BSi·X0·X1 (i=0 to 3). Therefore, when a row address input is supplied, 16 blocks belonging to the one selected by signal BSi from the four memory cell array groups 35A-0 and 35B-0, 35A-1 and 35B-1, 35A-2 and 35B-2, and 35A-3 and 35B-3 are activated simultaneously. Since the data is outputted from eight pairs of DQ lines in each block, the data from a total of 128 pairs of DQ lines is outputted. Because each block is refreshed at 512 row cycles, this gives 512×4=2K refresh cycles for the entire memory cell array of FIG. 4.

In the first embodiment, an 8-Mbit DRAM with 128 inputs/outputs at 2K refresh cycles is constructed. With the semiconductor memory device according to the first embodiment, the number of DQ buses drawn form each block is eight pairs. Therefore, 128 pairs of DQ buses, one-fourth of 512 pairs in the prior art, have only to be drawn for the entire memory cell array. As a result, the chip area occupied by the DQ buses (DQ line pairs) can be reduced remarkably.

In the first embodiment, although dividing the word lines increases the chip area, an increase in the area due to the row decoders is sufficiently small as compared with a decrease in the area of the DQ-line pairs, because the global row decoder is shared by the blocks in the same row and only the bootstrap circuit section is provided as a local row decoder in each memory cell array group, instead of providing an ordinary row decoder (i.e., a combination of the global row decoder and local row decoder in FIG. 6) in each memory cell array group. Consequently, with the DRAM of the first embodiment, the area of the entire chip can be decreased remarkably as compared with a conventional equivalent and a multibit input/output with a large number of refresh cycles can be realized.

Figure 7:
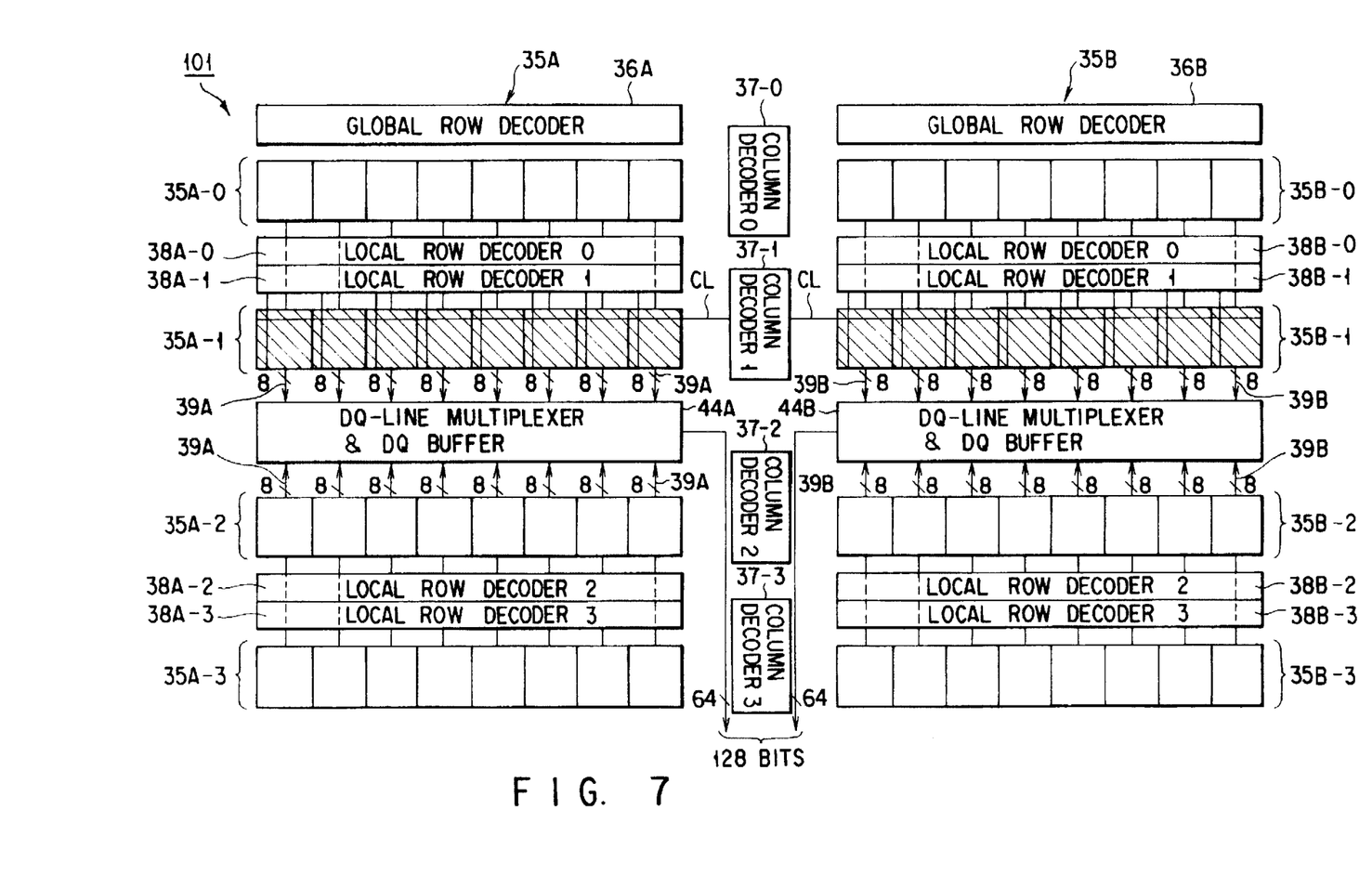
FIG. 7 is a block diagram of the memory core section extracted from a DRAM to help explain a semiconductor memory device according to a second embodiment of the present invention.

FIG. 7 is an explanatory diagram of a semiconductor memory device according to a second embodiment of the present invention, showing the memory core section 101 in a DRAM. The configuration of the peripheral circuit section is the same as that shown in FIG. 4. The DRAM of the second embodiment differs from the DRAM of the first embodiment in that the DQ bus is bisected in the direction of row, a DQ-line multiplexer and DQ buffers 44A, 44B are provided in the center of the chip, the data on the DQ bus is multiplexed by the DQ-line multiplexer, and a 128-bit output is produced. In this example, the memory cell array groups 35A-0, 35A-1, and the memory cell array groups 35B-0, 35B-1 share the DQ line pairs. The memory cell array groups 35A-2, 35A-3 and the memory cell arrays 35B-2, 35B-3 share the DQ line pairs. Therefore, for example, when the memory cell array groups 35A-1, 35B-1 are activated, the DQ line pairs on the side of the memory cell array groups 35A-0, 25A-1, 35B-0, 35B-1 are selected by the DQ-line multiplexers 44A, 44B. Then, the data is read out.

With the configuration, the parasitic capacitance of the DQ lines is reduced by dividing the DQ line pairs and a high-speed operation is achieved without impairing the advantage of the first embodiment that the chip area is reduced by decreasing the number of DQ-line pairs.

While in the first and second embodiments, the example of 2K refresh cycles has been explained, 4K refresh cycles may be used in the same manner, provided that the number of divisions of word lines is increased from 4 to 8. In this case, too, although the increased number of divisions increases the number of local row decoders, making the area that much larger, the area of the entire chip is decreased, because the number of DQ line pairs is one-eighth of that in the prior art (e.g., 128 pairs in the present invention for 64×16=1K pairs in the prior art), resulting in the further decreased area. Therefore, the advantage of the smaller area of the entire chip is the same as that in the case of 2K refresh cycles.

As described so far, with the present invention, a semiconductor memory device is achieved which makes multibit input/output with a large number of refresh cycles without making the chip size larger.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device comprising:

a memory cell array divided into m×n blocks, m columns of blocks in the direction of row and n rows of blocks in the direction of column, each block having dynamic memory cells arranged in a matrix;

sense amplifier means which are provided so as to correspond to said blocks and amplify the data read from the selected memory cell or the data to be written into the selected memory cell;

data buses provided so as to correspond to said blocks and connected to said sense amplifier means via column select gates;

row decode means for decoding a row address signal and selecting a row of memory cells in said memory cell array; and column decode means for decoding a column address signal and specifying a column of memory cells in said memory cell array, wherein those of the blocks arranged in the same row in said memory cell array share said row decode means and said data buses, those of the blocks arranged in the same column in said memory cell array share said column decode means, n blocks arranged in a column of said blocks are selectively activated simultaneously, and the data in the memory cells in the column selected by said column decode means is read and written in parallel via the individual data buses for said activated blocks.

2. A semiconductor memory device according to claim 1, wherein said row decode means includes main row decode means shared by the blocks in the same row, and subordinate row decode means arranged so as to correspond to the blocks in the same row, said subordinate row decode means being controlled so as to receive the output of said main row decode means and a subordinate row decoder select signal, activate one of the blocks in the same row, and select a row in said block.

3. A semiconductor memory device according to claim 1, wherein said row decode means includes a global row decoder shared by the blocks in the same row, and local row decoders arranged so as to correspond to the blocks in the same row, said local row decoders being controlled so as to receive the output of said global row decoder and a local row decoder select signal, activate one of the blocks in the same row, and select a row in said block.

4. A semiconductor memory device according to claim 3, further comprising a row address buffer to which a row address signal is supplied, and a row predecoder for predecoding the row address signal outputted from said row address buffer, wherein said global row decoder includes a logical product circuit that decodes the predecode signal outputted from said predecoder and the word-line precharge signal for controlling the precharging of word lines and drives a global word line, and each of said local row decoders includes a bootstrap-type booster circuit that steps up the potential of the selected local word line.

5. A semiconductor memory device according to claim 4, wherein said global word line is extended over those of the blocks arranged in the same row in said memory cell array, and said local word lines are provided for said blocks on a one-to-one basis and select the dynamic memory cells arranged in the same row in each of said blocks.

6. A semiconductor memory device according to claim 4, further comprising a row-system control circuit for controlling the circuits in the row system and outputting said word-line precharge signal, and a word-line potential generator circuit to which the predecode signal outputted from said row predecoder is supplied and which is controlled by said row-system control circuit and generates the potential of the selected local word line by supplying the word-line boosted potential to each of said local row decoders.

7. A semiconductor memory device according to claim 1, wherein said column decode means includes m column decoders arranged so as to correspond to the respective columns of blocks in said memory cell array.

8. A semiconductor memory device according to claims 7, wherein each of said m column decoders is arranged in the middle of each of n rows of blocks.

9. A semiconductor memory device according to claim 1, wherein said m×n blocks are divided into a plurality of subblocks in the direction of row, the blocks in the same row included in the subblocks share said data buses, the data buses connected to said subblocks are connected to the main data bus via a multiplexer, and said multiplexer is controlled so as to select the data bus connected to the subblocks including the activated blocks from said data buses and enable signal exchange between the main data bus and said data bus.

10. A semiconductor memory device according to claim 1, wherein said m×n blocks are divided into a plurality of subblocks in the direction of row and one of said plurality of subblocks in the blocks in the same row is activated simultaneously.

11. A semiconductor memory device according to claim 10, wherein said sense amplifier means include a plurality of sense amplifiers arranged so as to sandwich each of said plurality of subblocks and a pair of sense amplifiers sandwiching the activated one of said plurality of subblocks amplifies and holds the cell data in the activated subblock.

12. A semiconductor memory device according to claim 11, wherein said data buses are arranged so as to sandwich each of said plurality of subblocks and the data is inputted and outputted via a pair of data buses sandwiching the activated one of said plurality of subblocks.

13. A semiconductor memory device comprising:

a first dynamic memory cell array having a plurality of memory cell array groups divided in the direction of row;

a second memory cell array that is arranged adjacently in the direction of row of said first memory cell array and has a plurality of memory cell array groups divided in the direction of row;

column decoder groups arranged between the memory cell array groups in said first and second memory cell arrays;

common column select lines to which the decode output is supplied from said column decoder groups and which select a column of memory cells in each memory cell array group;

a first global row decoder for selecting a memory cell array group from said first memory cell array;

first local row decoder groups that are provided between the memory cell array groups in said first memory cell array and decodes the output of said first global row decoder and select a row of memory cells from said memory cell array groups;

a second global row decoder for selecting a memory cell array group from said second memory cell array;

second local row decoder groups that are provided between the memory cell array groups in said second memory cell array and that decode the output of said second global row decoder and select a row of memory cells from said memory cell array group;

first sense amplifier groups that are provided between the memory cell array groups in said first memory cell array and amplify the data read from the selected memory cell or the data to be written into the selected memory cell;

second sense amplifier groups that are provided between the memory cell array groups in said second memory cell array and amplify the data read from the selected memory cell or the data to be written into the selected memory cell;

first DQ bus groups connected to said first sense amplifier groups via first column select gate groups; and second DQ bus groups connected to said second sense amplifier groups via second column select gate groups, wherein the memory cell array groups in said first memory cell array share said first DQ bus groups, the memory cell array groups in said second memory cell array share said second DQ bus groups, the same columns in said first and second memory cell groups are selectively activated simultaneously, and the data in the memory cells in the column selected by said column decoder group is read and written in parallel via the first and second data DQ bus groups in said activated first and second memory cell array groups.

14. A semiconductor memory device according to claim 13, further comprising a first DQ-line multiplexer and a first DQ buffer provided adjacently to said first memory cell array and connected to said first DQ bus groups, a second DQ-line multiplexer and a second DQ buffer provided adjacently to said second memory cell array and connected to said second DQ bus groups, and an I/O buffer for exchanging data with said first and second DQ-line multiplexers and said first and second DQ buffers.

15. A semiconductor memory device according to claim 13, further comprising a first DQ-line multiplexer and a first DQ buffer provided between the memory cell array groups in said first memory cell array and connected to said first DQ bus groups, a second DQ-line multiplexer and a second DQ buffer provided between the memory cell array groups in said second memory cell array and connected to said second DQ bus groups, and an I/O buffer for exchanging data with said first and second DQ-line multiplexers and said first and second DQ buffers.

16. A semiconductor memory device according to claim 13, further comprising a row address buffer to which a row address signal is supplied, and a row predecoder for predecoding the row address signal outputted from said row address buffer, wherein each of said first and second global row decoders includes a logical product circuit that decodes the predecode signal outputted from said predecoder and the word-line precharge signal for precharging word lines and drives a pair of global word lines, and each of said first and second local row decoder groups includes a bootstrap-type booster circuit that steps up the potential of the selected local word line.

17. A semiconductor memory device according to claim 16, further comprising a row-system control circuit for controlling the circuits in the row system and outputting said word-line precharge signal, and a word-line potential generator circuit to which the predecode signal outputted from said row predecoder is supplied and which is controlled by said row-system control circuit and generates the potential of the selected local word line by supplying the word-line boosted potential to said first and second local row decoder groups.

18. A semiconductor memory device according to claim 13, wherein the memory cell array groups in said first memory cell array are divided into a plurality of first subblock groups in the direction of row and one of said plurality of first subblocks is activated simultaneously, and the memory cell array groups in said second memory cell array are divided into a plurality of second subblock groups in the direction of row and one of said plurality of second subblocks corresponding to said first subblocks is activated simultaneously.

19. A semiconductor memory device according to claim 18, wherein said first sense amplifier groups include a plurality of first sense amplifiers arranged so as to sandwich each of said plurality of first subblocks and a pair of sense amplifiers sandwiching the activated one of said plurality of first subblocks amplifies and holds the cell data in the activated first subblock, and said second sense amplifier groups include a plurality of second sense amplifiers arranged so as to sandwich each of said plurality of second subblocks and a pair of sense amplifiers sandwiching the activated one of said plurality of second subblocks amplifies and holds the cell data in the activated second subblock.

20. A semiconductor memory device according to claim 19, wherein said first DQ bus groups are arranged so as to sandwich each of said plurality of first subblocks and the data is inputted and outputted via a pair of said first DQ bus groups sandwiching the activated one of said plurality of first subblocks, and said second DQ bus groups are arranged so as to sandwich each of said plurality of second subblocks and the data is inputted and outputted via a pair of said second DQ bus groups sandwiching the activated one of said plurality of second subblocks.

\* \* \* \* \*